United States Patent [19]

Schmidt

[11] 4,048,949

[45] Sept. 20, 1977

[54] PLANETARY TURRET INDICATOR

[75] Inventor: Hans Schmidt, Schiller Park, Ill.

[73] Assignee: Matsushita Electric Company of America, Franklin Park, Ill.

[21] Appl. No.: 741,711

[22] Filed: Nov. 15, 1976

[51] Int. Cl.² ............................. F16H 35/00; H03J 1/02
[52] U.S. Cl. .................................. 116/124.3; 74/10.41;
74/10.8; 116/124 R; 334/87
[58] Field of Search ................. 116/124.2 R, 124.1 R,
116/124.3, 124 R, DIG. 29, DIG. 31; 334/86,
87; 74/10.41, 10.8

[56] References Cited

U.S. PATENT DOCUMENTS

| 2,754,697 | 7/1956 | Luebking | 74/781 R |
| 2,825,812 | 3/1958 | Felt | 334/87 |
| 3,886,890 | 6/1975 | Gibson et al. | 116/124.3 |
| 3,943,883 | 3/1976 | Ishigami et al. | 116/124.1 R |
| 3,972,240 | 8/1976 | Valdettaro | 74/10.8 |

Primary Examiner—Donald O. Woodiel
Assistant Examiner—Daniel M. Yasich
Attorney, Agent, or Firm—Drummond, Nelson & Ptak

[57] ABSTRACT

A turret indicator for a television receiver includes a stationary gear attached to a mounting base with a shaft passing through it. A rotatable carrier turret is mounted on the shaft and it carries five rotatable planetary indicator turrets which are programmed with channel numbers, five on each indicator turret to give a total of 25 indicating positions. When the rotatable carrier turret is rotated, the numerals on the indicator turrets appear sequentially at a viewing window in the television receiver cabinet.

10 Claims, 8 Drawing Figures

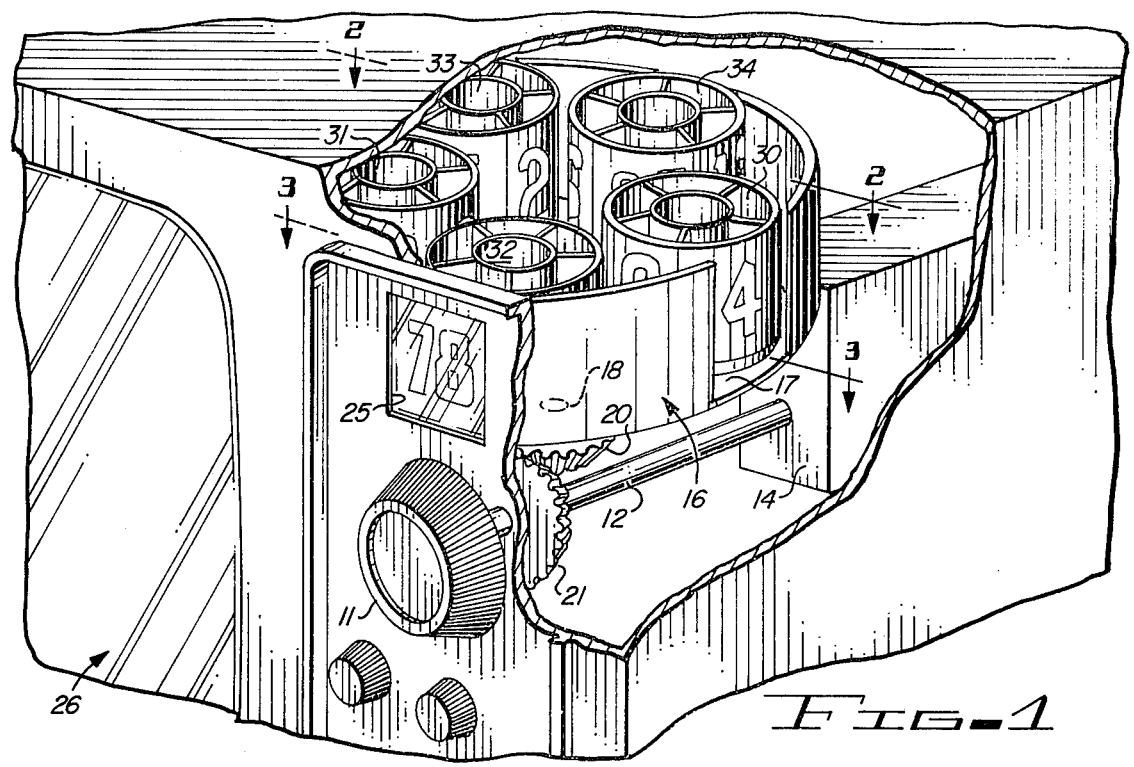
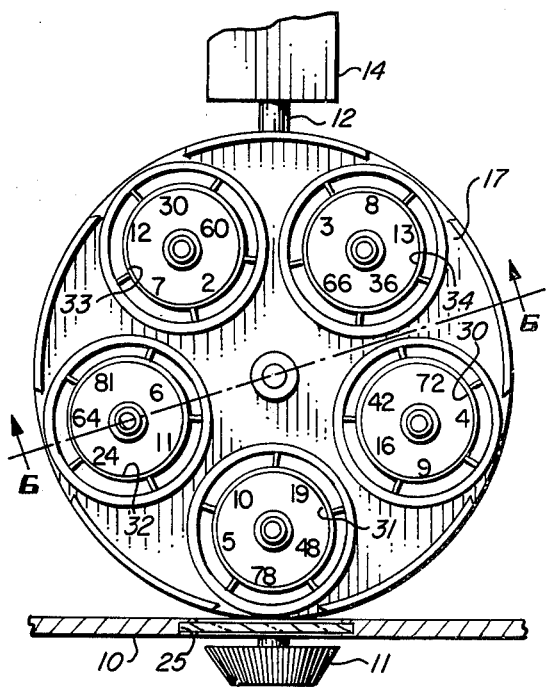
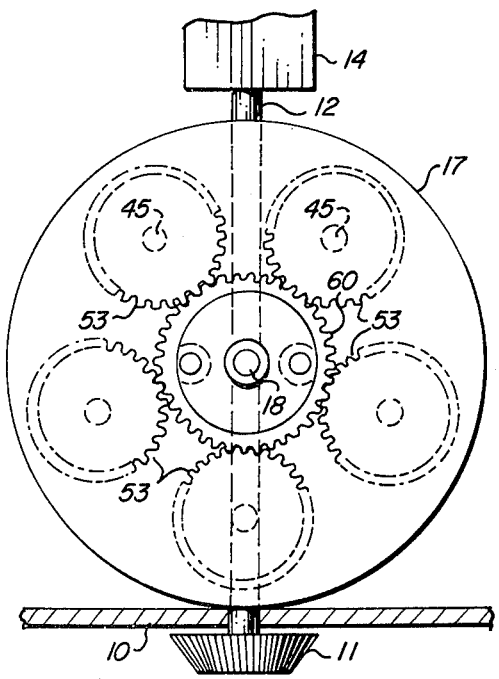
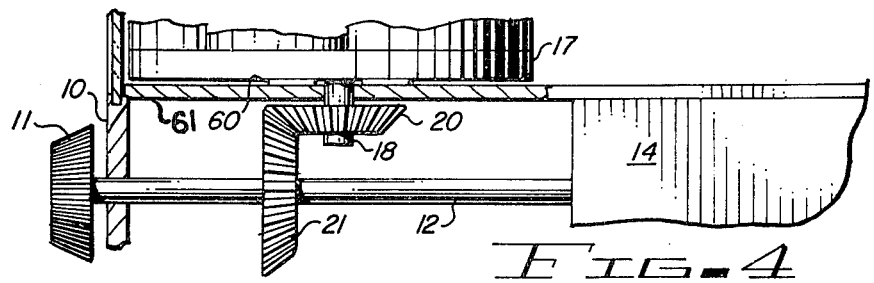

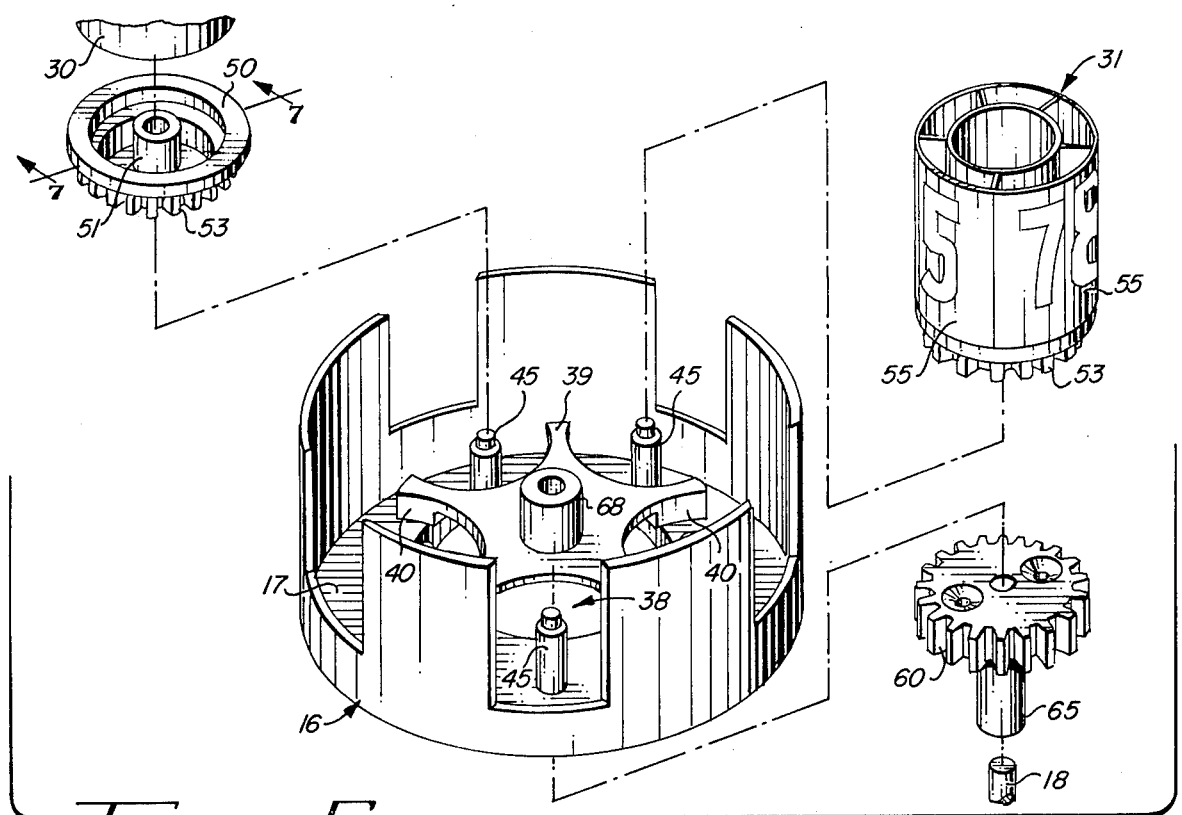
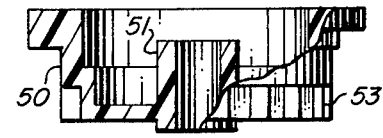
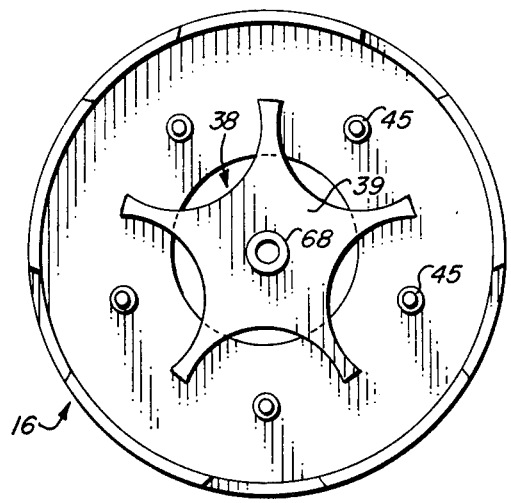
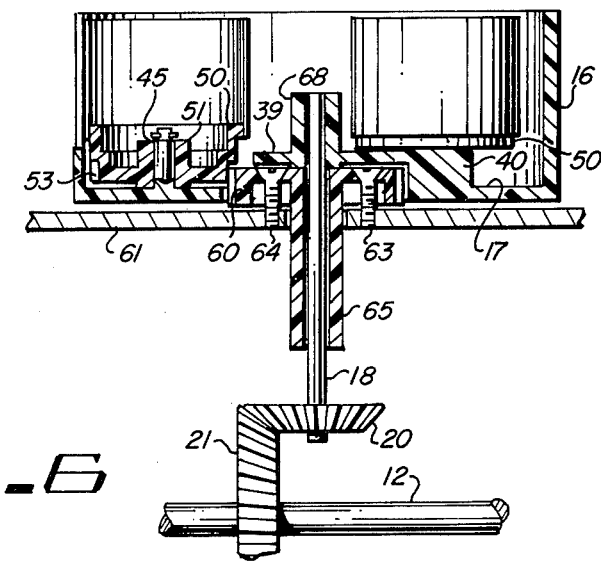

PLANETARY TURRET INDICATOR

BACKGROUND OF THE INVENTION

In television receivers, the advent of solid state integrated circuit electronic technology has permitted a substantial reduction in the space required within a cabinet for housing the electronic components. As a consequence, the cabinet size is primarily dictated by the size of the picture tube and the space required for the tuner, channel number display mechanism, and other control knobs and switches for operating the receiver. It is desirable to make the television receiver as compact and lightweight as possible, both to increase the portability of such receivers and also to decrease their weight and size. One of the limiting factors in design flexibility and in reducing the size of a television receiver cabinet, however, is the tuner and channel number display mechanism.

Since the programs displayed on television receivers are generally viewed from a substantial distance, such as 10 or 15 feet, it is necessary to display the channel number indicia as large as possible; so that it may be readily discerned from a viewing position across the room. Large channel number indicia, however, are somewhat incompatible with compact channel number display mechanisms. One method for displaying channel numbers is to imprint the channel numbers for the VHF channels and/or UHF channels on a translucent disc which is concentrically mounted on the channel number tuner selector shaft for rotation with the shaft. The numbers on the disc are then rotated to a window viewing position where they may be observed by the television set viewer. Generally, a suitable light source is placed behind the indicia disc to illuminate the numbers. Because of the distance involved, it is desirable to make the numbers fairly large, approximately ¾ inch to 1 inch in height, and if they are placed on a disc of this type, it is apparent that a relatively large-diameter disc is required to accommodate all the different numbers. To overcome the problem of the large size inherent in such an approach, other techniques for displaying channel numbers have been used and proposed.

One solution is a combination of a channel number disc or drum of the type described above but in which the numbers are much smaller. These numbers are then projected through an optical magnifying lens system which projects the selected channel number to the viewer through a channel number indicator aperture in the cabinet. Such a system, however, results in an increased expense because of the optical system required. Another solution which has been proposed is to electronically decode either the rotational shaft position of the channel selector shaft or to use a digital channel selection and drive appropriate seven-segment illuminated digital displays to produce and display the selected channel number. This type of system, however, requires relatively expensive electronic circuitry and the associated electronic display segments to accomplish the channel number display.

Another system which has been proposed is to generate channel number indicia electronically and to couple this generated indicia signal into the video signal of the television receiver, either momentarily on command or each time a channel number is displayed; so that the channel number then is viewed directly on the picture tube screen of the television receiver. Once again, additional electronics is required to effect such a channel number display. A drawback of this latter type of system is that such displays are generally temporary; so that the viewer does not know what channel he is watching during the course of the program unless he effects an appropriate channel number display command. Alternatively, if such a channel number indicia display is permanently present in a small portion of the TV picture, it detracts from the video portion of the television program material which is being watched.

A mechanical alternative to the foregoing systems is to place the channel numbers on an endless belt or tape which is moved in accordance with the rotation of the channel selection knob of a mechanical tuner. The different detented positions of the channel selector knob then cause the movement of the channel number display belt or belts to be effected to display the proper indicia for the selected channel number in a display window in the television cabinet. Under some operating conditions, the plastic material which typically is used in such belts may become brittle and break. In addition, such endless belt-type display systems generally are found to exhibit a relatively high amount of mechanical friction. This is undesirable.

It is desirable to provide a turret indicator for indicating the channel numbers of selected channels in a television receiver, or for indicating rotational positions in other devices, which is capable of displaying large numerals or indicia for a large number of indicator positions in a relatively small space, with a relatively simple mechanical mechanism capable of being manufactured at low cost.

SUMMARY OF THE INVENTION

Accordingly, it is an object of this invention to provide an improved indicia display device.

It is an additional object of this invention to provide an improved indicia display device for displaying relatively large indicia for a large number of indicator positions in a relatively small space.

It is another object of this invention to provide an improved turret indicator.

It is a further object of this invention to provide an improved mechanical channel number indicator for a television receiver.

It is still another object of this invention to provide a turret indicator having a small number of parts for storing and indicating a large number of indicator positions in a relatively small space, utilizing large numerals and having a minimum of friction.

In accordance with a preferred embodiment of this invention, a turret indicator for providing numerical indication of relative rotational positions includes a rotatable carrier turret mechanism which is rotatable to at least N predetermined equi-angularly spaced rotational positions within each complete 360° rotation thereof, where N is a positive integer greater than 1. Mounted on the rotatable carrier turret mechanism are N planetary indicator turret members each of which have N equi-angularly spaced indicia portions on them. Each of the indicia portions on the planetary indicator turret members are associated with a segment comprising 360/N degrees of such planetary indicator turret members. Similarly, each of the N planetary indicator turret members are spaced 360/N degrees about the axis of rotation of the carrier turret mechanism, and a drive mechanism causes the planetary indicator turret members to rotate $360n \pm (360/N)$ degrees for each 360° of rotation of the carrier turret, where n is any positive integer.

BRIEF DESCRIPTION OF THE DRAWINGS

FIG. 1 is a partially cut-away perspective view of a television receiver cabinet, with a preferred embodiment of a channel member turret indicator mechanism shown mounted in it;

FIG. 2 is a top view of the mechanism of FIG. 1;

FIG. 3 shows the driving and driven gear arrangement for the mechanism of FIGS. 1 and 2;

FIG. 4 shows additional details of the mechanism of FIG. 1;

FIG. 5 is an exploded view showing different parts of the mechanism of FIG. 1;

FIGS. 7 and 8 are detailed views of portions of the mechanism shown in FIG. 5; and FIG. 6 is a sectional view of the mechanism assembly shown in FIGS. 1 and 5.

DETAILED DESCRIPTION

Referring now to the drawings, the same reference numerals are used throughout the several figures to designate the same or similar components. While the turret indicator display mechanism shown in the drawings has applications in a number of fields for indicating different relative rotational positions of a shaft or other rotatable member, the indicator is particularly suited as a channel number indicator for a television receiver. At the present time, it is necessary to provide compatible tuning and compatible display of the VHF and UHF channels to which a television receiver may be tuned. As a consequence, the requirements for channel number display have been substantially complicated over that which existed when non-compatible tuning and display was permitted.

In any given location of a television receiver, not all of the maximum number of VHF and UHF channels to which a receiver may be tuned are broadcast. As a consequence if a receiver is capable of displaying all of the VHF channel numbers and a comparable number of UHF channel numbers, compatible channel number display can be effected, provided that the receiver is uniquely programmed to display the UHF channels which are available in the area in which the receiver is used. It is this type of channel number display which is used in the turret indicator shown mounted in the upper right-hand corner of a television receiver cabinet 10 in FIG. 1. The particular details of the tuning mechanism and electronic circuitry of the television receiver are not important to an understanding of the channel number display mechanism shown in FIG. 1. The display mechanism, however, is one which is used in conjunction with a rotating channel selector knob 11 used to rotate a channel number selection tuning shaft 12 connected to a suitable turret tuner 14 of the type commonly used in conjunction with television receivers. The tuner 14 typically includes both VHF and UHF sections and appropriate switches for effecting control of the tuning of the television receiver from one or the other of these sections. Again, a number of ways exist in the art by which this is accomplished, and the details of this operation are unimportant to an understanding of the operation of the channel number turret indicator of this invention.

The turret indicator shown in FIG. 1 includes a carrier turret member 16 having a generally circular base 17 which is attached to a shaft 18 for rotation with the shaft which terminates in a bevel gear 20. The gear 20 is rotated along with the rotation of the tuner control shaft 12 by a mating bevel gear 21 attached to the shaft 12. The details of these gears and their relationships to the other components in FIG. 1 are shown most clearly in the partial cut-away view of FIG. 4. Typically, the shaft 12 has a number of detented positions which are easily sensed by a person rotating the knob 11, so that movement from one detented position to the next effects corresponding rotation to pre-established detented positions in the tuner 14 to sequentially tune the television receiver to predetermined channels. Typically, this includes all of the VHF channels; and, in a given locality, the UHF portion of the tuner 14 correspondingly may be preset to the different UHF channels which are available in that locality.

A correlation then is to be made between the detented rotational positions of the shaft 12 and a channel number display which is effected at a channel number display window or aperture 25 in the front of the cabinet 10 of the receiver, generally adjacent the picture tube 26. One such channel number — namely, 78 — is shown in the display window 25 in FIG. 1. The individual channel number displays to which the mechanism of FIG. 1 may be programmed include 25 different channel number indicia, five of which are carried on five equi-angular segments of five different planetary indicator turrets 30, 31, 32, 33 and 34, respectively. These indicator turrets each are rotatably mounted at five equi-angular locations about the axis of rotation of the carrier turret member 16 on the base 17 of the carrier turret member. This arrangement is shown most clearly in FIG. 2, which also shows a typical channel numbering sequence for each of the indicia segments of the indicator turret members 30 through 34.

Reference now should be made to FIG. 5 which shows the manner in which the various parts of the mechanism of FIGS. 1 and 2 are assembled. The carrier turret member 16 is preferably formed of an integral unitary molded plastic material in which a circular aperture 38 is formed in the center of the base 17. This aperture is bridged by a generally star-shaped member 39 which bridges and is located above the aperture 38 on five legs 40, as shown in FIGS. 5 and 6. The star-shaped member 39, as shown most clearly in FIG. 8, includes semi-circular cut-out portions which are concentric with five upstanding mounting shafts 45 on which each of the planetary indicator turret members 30 to 34 are rotatably mounted. Each of these semi-circular cut-out portions on the star-shaped member 39 is concentric with the different shafts 45 and has a radius sufficient to overlie the circular aperture 38, as shown most clearly in FIG. 8.

Each of the planetary indicator turret members 30 to 34 is formed of an assembly having a circular base 50 (shown in the upper left-hand corner of FIG. 5 and in FIG. 7) with a central shaft-engaging hub 51 which has an internal diameter slightly larger than the external diameter of the shafts 45 on the carrier turret 16 to permit the base member 50 to be slipped over the corresponding shaft 45. Each planetary indicator turret member then is freely rotatable about the shaft 45 on which it is placed. The lower side of the base 50 of the turret members 30 to 34 is a gear 53, which has an external diameter sufficient to cause it to extend outwardly over the opening 38 in the base 17 of the carrier turret 16.

Each of the planetary indicator turret members 30 through 34, in the embodiment shown, has five equi-angularly spaced indicia faces on it. Thus, each 72 degree segment of each of the indicator turret members 30 through 34 has a different channel number display surface on it. A typical set of channel number displays is partially indicated for the turret member 31 in FIG. 5. It is to be understood that the other indicator turret members 30 and 32 to 34 have comparable displays, each carrying different indicia on each of the five different display segments. The particular number sequence for a turret indicator carrying all of the VHF channels 2 through 13 and 13 preselected UHF channels is shown in FIG. 2. Since at least the UHF channels should be capable of selective programming for the particular area in which the receiver is used, the indicia faces 55 on the planetary indicator turret members 30 to 34 each should be removable.

When the carrier turret 16 is rotated in the direction of the arrow shown in FIG. 2, each of the different planetary indicator turret members 30 through 34 is sequentially brought into position opposite the indicator window or aperture 25 in the television receiver cabinet for each detented position of rotation of the channel selector knob 11. As shown in FIG. 2, the indicator turret 31 is in location to display selected channel number 78. Rotation of the channel selector knob 11 clockwise to its next detented position causes a counterclockwise movement of the carrier turret 16 (as viewed in FIG. 2) to bring the indicator turret 32 opposite the window 25. When this is done, it is necessary to effect a partial rotation of the turret 32 to cause it then to display the UHF channel number 81 (as the programming of the turrets in FIG. 2 is indicated) through the aperture 25. In order to do this, the gears 53 on the bottoms of each of the turret indicators 30 through 34 engage a stationary drive gear 60 attached to a shelf member 61 in the television receiver cabinet. The stationary gear 60 is concentrically mounted on the shaft 18 which is used to rotate the carrier turret 16 in conjunction with the rotation of the channel selector knob 11. This structural relationship is shown most clearly in FIG. 6 which shows the fixed gear 60 attached to the shelf 61 by means of a pair of screws 63 and 64.

To provide stability for the assembly and to align the shaft 18, the gear 60 has a downwardly depending hub portion 65 through which the shaft 18 passes. The carrier turret 16 has a central upstanding hub portion 68 (FIGS. 5 and 6) into which the shaft 18 is inserted for a tight frictional fit, so that the carrier turret 16 and the shaft 18 turn together. If necessary, the hub 68 and shaft 18 may be keyed together in a suitable manner. When the unit is assembled as shown in FIG. 6, the upper side of the stationary gear 60 serves as a bearing surface for the lower side of the star-shaped portion 39 of the carrier turret 16, which is free to rotate under the control of the shaft 18 on the upper surface of the gear 60.

When the planetary indicator turret members 30 through 34 are assembled together as shown in FIGS. 1 and 5, the gears 53 on the bottom of each of the planetary indicator turret members mesh with the stationary gear 60, as shown most clearly in FIGS. 3 and 6. For the assembly illustrated in the drawings, the ratio of the gears 53 to the stationary gear 60 is 5:6, five for the gears 53 and six for the stationary gear. With this gear ratio, each five sequential detented rotational positions of the tuner knob 11 and its shaft 12 causes a full 360° revolution of the shaft 18, which results in a five-step sequential positioning of the planetary indicator turret members 30 through 34 in the direction of the arrow as shown in FIG. 2. If the starting point is with the member 31 in the position shown in FIG. 2, the next detented rotation of the knob 11 brings the indicator turret member 32 into alignment with the indicator aperture 25 in the TV receiver cabinet. The following detented position brings the indicator turret number 33 into alignment with the aperture 25, and so forth, until the fifth detented position once again returns the turret member 31 to the position shown in FIG. 2. Since the gear 60 is fixed, however, this rotation of the carrier turret 16 causes the gears 53 to rotate the planetary indicator turret members about their axes on the shafts 45.

Since each indicator segment on the planetary indicator turret members 30 through 34 occupies 72° (360 divided by 5), in order to display sequentially each of the indicia which are carried by the indicator turret members, it is necessary to have each of the planetary indicator turret members rotate 360° plus 72° for each 360° revolution of the carrier turret 16. This is accomplished by the 5:6 gear ratio described above. Alternatively, it is possible that the gear ratio could be selected to effect less than 360° rotation of each of the planetary turret members 30 to 34 by the same amount, that is, for each 360° revolution of the carrier turret 16, each of the planetary turret members 30 through 34 would rotate 360 minus 72°. This would accomplish the same end result except that the numbering sequence of the channel number indicia on the turret members would be reversed from that shown in FIG. 2.

If the number of indicia segments on each of the planetary indicator turret members 30 through 34 is different from the five segments shown in the above-described example, the gear ratios also would have to be modified to accomplish the same results. If the number of display segments is varied, a corresponding variation must be made in the number of planetary indicator turret members. For example, if four display indicia segments were carried by each of the planetary indicator turret members, only four such turret members would be used. Then each of these four planetary indicator turret members would be located at 90° angles with respect to the axis 18 of the rotatable carrier turret member 16. Similarly, then, each detented position of rotation of the channel selector knob 11 would cause a 90° rotation of the carrier turret member 16. For N planetary gear members each having N display indicia segments on them, where N is a positive integer greater than 1, the formula for determining the ratio of the gears 53 to the stationary gear 60 is:

$$N: (N)(n) \pm (1/n)$$

where $n$ is any positive integer (but preferably is 1). With this relationship, each of the N equi-angularly spaced indicia portions on the planetary indicator turret members occupies a segment comprising 360/N degrees of the planetary indicator turret member; and each of the N planetary indicator turret members are spaced 360/N degrees about the axis of rotation of the carrier turret member 16. The factor $n$ in the above formula is present since it is possible to cause each of the planetary indicator turret members to rotate by multiples of full 360° revolution ± the number of degrees of each segment divided by such multiple for each single 360° rotation of the carrier turret 16. This, of course, would present substantially increased mechanical wear on the system so that, for all practical purposes, $n$ generally is the positive integer number 1, reducing the formula for the gear ratios to N:N ± 1.

The system which has been described above further can be enhanced by using translucent display indicia on the planetary indicator turret members with a light source located in each of the members or directly above the member which is in the location for displaying a number through the aperture 25. This, then, would give a backlighted effect to the number viewed by the operator of the television receiver through the aperture 25. The manner in which the indicia is illuminated or otherwise enhanced to facilitate the indicia display is not important to an understanding of the invention and can be accomplished in a number of ways which will be readily apparent to those skilled in the art.

The turret indicator for displaying the channel numbers sequentially is such that, with the number arrangements shown in FIG. 2, the display sequence readily may be seen to be as follows: First of all, when the indicator turret member 31 is in the position shown in FIG. 2, channel number 78 is displayed. Then, when the next 1/5 revolution of the carrier turret 16 is accomplished, the turret 32 is in place and channel number 81 is displayed. This sequence for each one-fifth revolution of the carrier turret 16 then places indicator turret 33 in position to display channel number 2, next turret 34 for channel number 3, turret 30 for channel number 4, turret 31 for channel number 5, etc. Of course, the indicator positions displaying the channel number indicia in the aperture 25 must be coordinated with the corresponding operation of the tuner 14. This is not difficult and is simply the same type of adjustment which is commonly made with conventional displays for mechanical detent tuners in television receivers.

A typical display of the type described, having display indicia approximately ¾ inch high, has a diameter of 3¼ inches for the carrier turret 16 and an overall height of 1¼ inches. Thus, it is readily apparent that the mechanism clearly achieves the objectives mentioned previously.

I claim:

1. A turret indicator for providing numerical indications of relative rotational positions of a rotating member including, in combination:
    a rotatable carrier turret means rotatable to N predetermined equi-angular spaced rotational positions within each complete 360° rotation thereof, where N is a positive integer greater than 1;
    means for rotating said carrier turret means;
    N planetary indicator turret members, each having N equi-angular spaced indicia portions thereon, each indicia portion associated with a segment comprising 360/N degrees of such planetary indicator turret member, and said N planetary indicator turret members being mounted on said rotatable carrier turret means and being spaced each 360/N degrees about the axis of rotation of said carrier turret means; and
    drive means responsive to the rotation of said rotatable carrier turret means to said spaced rotational position and coupled with said planetary indicator turret members for rotating each of said planetary indicator turret members $360n \pm (360/N)$ degrees for each 360° rotation of said carrier turret means, where $n$ is any positive integer.

2. The combination according to claim 1 wherein said drive means comprises a driving gear which is stationary relative to said rotatable carrier turret means and driven gear means for rotating each of said planetary indicator turret members, said driven gear means engaging said driving gear, and the ratio of said driven gear means to said driving gear being $N:Nn \pm (1/n)$.

3. The combination according to claim 2 wherein said ratio is N:N+1.

4. The combination according to claim 1 further including a shaft coupled to said rotatable carrier turret means for rotating the same, wherein each 360° rotation of said shaft effects a comparable 360° rotation of said rotatable carrier turret means, and wherein N rotations of said shaft causes each of the N times N indicia portions on said N planetary indicator turret members to be displayed at a predetermined fixed location adjacent said planetary indicator turret members.

5. The combination according to claim 4 wherein N is 5 and $n$ is 1.

6. A turret indicator for a television receiver for providing channel number indications of sequential detented rotational positions of a tuner shaft including, in combination:
    a rotatable carrier turret mechanism coupled with said tuner shaft and rotatable to at least N predetermined equi-angular spaced rotational positions within each complete 360° rotation thereof, where N is a positive integer greater than 1, and each of said N equi-angularly spaced rotational positions corresponds with successive detented rotational positions of said shaft;
    N planetary indicator turret members, each having N equi-angularly spaced indicia portions thereon, where each indicia portion indicates a different channel number and is associated with a segment comprising 360/N degrees of one of said planetary indicator turret members, said N planetary indicator turret members being attached to said rotatable carrier turret mechanism and being spaced each 360/N degrees about the axis of rotation of said carrier turret mechanism; and
    drive means responsive to the rotation of said rotatable carrier turret mechanism to each sequential detented position of the tuner shaft and coupled with said planetary indicator turret members for rotating each of said planetary indicator turret members $360n \pm (360/N)$ degrees for each 360° of rotation of said carrier turret mechanism, where $n$ is any positive integer.

7. The combination according to claim 6 wherein said drive means comprises a driving gear which is stationary relative to said rotatable carrier turret means and driven gear means for rotating each of said planetary indicator turret members, said driven gear means engaging said driving gear, and the ratio of said driven gear means to said driving gear being $N:Nn \pm 1/n$.

8. The combination according to claim 7 wherein said ratio is N:N+1.

9. The combination according to claim 6 wherein N complete 360° rotations of said rotatable carrier turret mechanism causes each of the N times N indicia portions on said N planetary indicator turret members to be displayed at a predetermined fixed location adjacent said planetary indicator turret members.

10. The combination according to claim 9 wherein N is 5 and $n$ is 1.

* * * * *